(12) United States Patent
Mitchell

(10) Patent No.: US 7,995,638 B2
(45) Date of Patent: Aug. 9, 2011

(54) HIGH POWER, END PUMPED LASER WITH OFF-PEAK PUMPING

(75) Inventor: Gerald Mitchell, Los Altos, CA (US)

(73) Assignee: Laserscope, Minnetonka, MN (US)

( * ) Notice: Subject to any disclaimer, the term of this patent is extended or adjusted under 35 U.S.C. 154(b) by 0 days.

(21) Appl. No.: 12/034,756

(22) Filed: Feb. 21, 2008

(65) Prior Publication Data

US 2008/0144690 A1    Jun. 19, 2008

Related U.S. Application Data

(62) Division of application No. 11/261,010, filed on Oct. 28, 2005, now abandoned.

(51) Int. Cl.
*H01S 3/091* (2006.01)

(52) U.S. Cl. ............... 372/71; 372/70; 372/41; 372/40; 372/10; 372/21; 372/93

(58) Field of Classification Search ............ 372/71, 372/7, 41, 40, 10, 21, 930
See application file for complete search history.

(56) References Cited

U.S. PATENT DOCUMENTS

| | | | |
|---|---|---|---|
| 4,907,235 A | 3/1990 | Kuizenga | |
| 4,974,230 A | 11/1990 | Hemmati | |
| 5,530,709 A * | 6/1996 | Waarts et al. ................. | 372/6 |
| 5,638,397 A | 6/1997 | Nighan, Jr. et al. | |
| 5,689,522 A | 11/1997 | Beach | |
| 5,844,149 A | 12/1998 | Akiyoshi et al. | |
| 5,859,868 A | 1/1999 | Kyusho et al. | |
| 5,907,570 A | 5/1999 | Nighan et al. | |
| 6,026,101 A | 2/2000 | Suzudo et al. | |
| 6,069,907 A | 5/2000 | Chang | |
| 6,185,236 B1 | 2/2001 | Eichenholz et al. | |
| 6,246,706 B1 | 6/2001 | Kafka et al. | |
| 6,347,101 B1 | 2/2002 | Wu et al. | |

(Continued)

FOREIGN PATENT DOCUMENTS

JP    4137775    5/1992

OTHER PUBLICATIONS

Bi, Young et al., "Configuration to improve second-harmonic-generation conversion efficiency", Applied Optics, Feb. 10, 2004, vol. 43 No. 5, pp. 1174-1179.

(Continued)

*Primary Examiner* — Kinam Park

(74) *Attorney, Agent, or Firm* — Kimberly K. Baxter; Gregory L. Koeller

(57) ABSTRACT

A laser configuration producing up to 100's of Watts of output is provided, based on a solid-state gain medium, a source of pump energy which is detuned from the maximum absorption wavelength for the gain medium, and optics arranged to deliver the pump energy through an end of the gain medium to propagate along the length of the gain medium. The length of the gain medium and the doping concentration in the gain medium are sufficient the absorption length is on the order of 10's of millimeters, and more than ⅓ of the length, and that 90 percent or more of the pump energy is absorbed within two or fewer passes of the gain medium. A pump energy source that supplies 100 Watts to 1000 Watts or more.

50 Claims, 4 Drawing Sheets

U.S. PATENT DOCUMENTS

| | | | |
|---|---|---|---|
| 6,366,596 B1 * | 4/2002 | Yin et al. ............... 372/92 |
| 6,407,535 B1 | 6/2002 | Friedman et al. | |
| 6,421,573 B1 | 7/2002 | Kafka et al. | |
| 6,483,858 B1 | 11/2002 | Hovater et al. | |
| 6,504,858 B2 | 1/2003 | Cheng et al. | |
| 6,570,902 B2 | 5/2003 | Peressini | |
| 6,661,568 B2 | 12/2003 | Hollemann et al. | |
| 6,671,305 B2 | 12/2003 | Knights et al. | |
| 6,898,231 B2 * | 5/2005 | Butterworth ............... 372/71 |
| 2004/0101015 A1 * | 5/2004 | Butterworth ............... 372/70 |

OTHER PUBLICATIONS

Honea, Eric, C. et al "115-W Tm:YAG Diode-Pumped Solid-State Laser", IEE Journal of Quantum Electronics, Sep. 1997, vol. 33 No. 9, pp. 1592-1600.

Honea, Eric, C. et al. "Analysis of an intracavity-doubled diode-pumped Q-switched Nd YAG laser producing more that 100 W of power at 0.532 μm" Optical Letters, Aug. 1, 1998, vol. 23 No. 15, pp. 1203-1205.

Kasamatsu, Tadashi et al., "Laser-diode-pumped Nd:YAG active-mirror laser" Applied Optics, Mar. 20, 1997, vol. 36, No. 9, pp. 1879-1881.

Lai, K.S. et al. "120-W continuous-wave diode-pumped Tm:YAG laser" Optics Letters, Nov. 1, 2000, vol. 25 No. 21, pp. 1591-1593.

Liu, Qiang, et al. "520-W continuous-wave diode corner-pumped composite Yb:YAG slab laser", Optics Letters, Apr. 1, 2005, vol. 30 No. 7, pp. 726-728.

Paschotta, R., et al. "Diode-pumped passively mode-locked lasers with high average power" Appl. Phys. B., May 24, 2000, 70 [Suppl.], pp. S25-S31.

Schiehlen, Eckart, et al., "Diode-Pumped Semiconductor Disk Laser With Intracavity Frequency Doubling Using Lithium Triborate (LBO)" IEEE Photonics Technology Letters, Jun. 2002, vol. 14 No. 6 pp. 777-779.

Mingxin, Qiu, et al. "Performance of a Nd:YVO4 microchip laser with with continusous-wave pumping at wavelengths between 741 and 825 nm" Applied Optics, Apr. 20, 1993, vol. 32 No. 12, pp. 2085-2086.

Martel, G., et al. "Experimental and theoretical evidence of pump-saturation effects in low power end-pumped Nd:YVO4 microchip laser" Optics Communications, Sep. 28, 2000, vol. 185, pp. 419-430.

Tusnekane, M., "High power operation of diode-end pumped Nd:YVO4 laser using composite rod with undoped end", Electronic Letters, Jan. 4, 2005, vol. 32 No. 1, pp. 40-42.

Hardman, P.J. "Energy-Transfer Upconversion and Thermal Lensing in High-Power End-Pumped Nd:YLF Laser Crystals", IEEE Journal Quantum Electronics, Apr. 4, 1999, vol. 35 No.

Pollnau, M., "Upconversion-induced heat generation and thermal lensing in Nd:YLF and Nd:YAG", Physical Review B, Dec. 15, 1998, vol. 58 No. 24., pp. 076-091.

Lin, Guo, et al., "Diode-end-pumped passively mode-locked ceramic Nd:YAG Laser with a semiconductor saturable mirror" Optics Express, May 30, 2005, vol. 13 No. 11, pp. 4085-4089.

* cited by examiner

HIGH POWER, END PUMPED LASER WITH OFF-PEAK PUMPING

RELATED APPLICATIONS

This application is a divisional of U.S. patent application Ser. No. 11/261,010 filed 28 Oct. 2005, which application is incorporated by reference as if fully set forth herein.

BACKGROUND OF THE INVENTION

1. Field of the Invention

The present invention relates to laser systems, and more particularly to high-power, end-pumped laser systems with solid-state gain media.

2. Description of Related Art

High power laser output is desired over a broad range of wavelengths and disciplines throughout the scientific, industrial and medical fields. Many systems have been developed to generate high-power. However, systems generating output power levels in excess of several hundred Watts become very complex. Also, some systems generate such high-powers only at the expense of beam quality.

In solid-state systems, in order to generate a higher output powers, the amount of energy used for pumping the gain medium is increased. However, many solid-state media exhibit thermal lensing or other problems causing aberrations in output beam. The pump energy can be applied from the side of the gain medium, known as a side-pumping, or from the end of the gain medium, known as the end-pumping, in most systems. Other systems create complex optics for filling a gain medium with pump energy. Side-pumping is relatively inefficient; so that the conversion of pump energy into laser output is low at relatively high pump energies. End-pumping is more efficient. However, an upper limit is quickly reached for end-pumped gain media, where rapid absorption of pump energy in a small volume within the first few millimeters of the gain media causes thermal fracture. Thermal damage to solid-state gain media can be controlled by sophisticated cooling techniques, such as is employed in so-called disk lasers. Also, thermal lensing which occurs in some solid-state gain media can be managed by including undoped endcaps. An undoped end-cap bonded on a gain medium prevents deformation at the surface of the gain medium due to the high absorption and heat generation on the surface.

Techniques have been investigated that increase the volume of the gain medium in which the pump energy is absorbed, and in which the resulting heat is generated, to prevent thermal damage and manage thermal lensing. One way to distribute heat generation within the gain medium which has been investigated includes reducing the doping concentration of the active material. At lower doping concentrations, less energy is absorbed within a given volume. See, Honea et al., "Analysis of intracavity-doubled diode-pumped Q-switched Nd:YAG laser producing more than 100W of power at 0.532 μm," OPTICS LETTERS, Vol. 23, No. 15, Aug. 1, 1998, pages 1203-1205.

Butterworth, U.S. Pat. No. 6,898,231 B2 describes a laser based on a gain medium comprising neodymium Nd doped yttrium orthovanadate ("vanadate"), in which the pump energy is set at a wavelength which is absorbed with an efficiency substantially less than that of the peak absorption wavelengths, thereby allowing more of the pump energy to penetrate a greater volume of the gain medium before being absorbed and distributing the generated heat. In the Butterworth patent for example, the vanadate crystal was on the order of five millimeters long, and the doping concentration was relatively high at about 0.5 atomic percent. Hardman et al., "Energy-Transfer up Conversion and Thermal Lensing and High-Power End-Pumped Nd:YLF Laser Crystals," IEEE JOURNAL OF QUANTUM ELECTRONICS, Volume 35, No. 4, April 1999, describes a longitudinally pumped laser with the pump wavelength detuned in order to increase the absorption length within the YLF host to about three millimeters. Pollnau et al., "Up Conversion-Induced Heat Generation and a Thermal Lensing in Nd:YLF and Nd:YAG," PHYSICAL REVIEW B, Volume 58, No. 24, 15 Dec. 1998, p. 16076-16092, also describes off-peak pumping for a YLF host, while suggesting that off-peak pumping is not necessary for a YAG host because "rod fracture is not a problem." (See, Pollnau et al., page 16077). See also, Wu et al., U.S. Pat. No. 6,347,101 B1; and Chang et al., U.S. Pat. No. 6,504,858 B2. The Wu et al., Chang et al., Butterworth, Hardman et al. and Pollnau et al. publications describe systems that use relatively low pump powers from diode lasers, on the order of 20 or 30 Watts. The resulting output powers of the lasers are therefore relatively small, and not suitable for many applications.

High power outputs have been achieved for Tm:YAG diode pumped lasers producing 2 μm wavelength outputs, and applying off-peak pumping with pump powers over 300 Watts. Tm doped media demonstrate two-for-one cross relaxation, improving pumping efficiency, so long as the pump intensity is high enough. Honea et al. report up to 115 W 2 μm wavelength outputs in this configuration, with off peak pumping. Honea et al., "115-W Tm:YAG Diode-Pumped Solid-State Laser," IEEE JOURNAL OF QUANTUM ELECTRONICS, Vol. 33, No. 9, September 1997, pages 1592-1600.

It is desirable to provide a laser system generating high-quality, high-power outputs in a manufacturable configuration.

SUMMARY OF THE INVENTION

A high quality laser easily producing over 100 Watts output power is provided using a laser configuration, described herein, based on a solid-state gain medium, a source of pump energy which is detuned from the maximum absorption wavelength for the gain medium, and optics arranged to deliver the pump energy through an end of the gain medium to propagate along the length of the gain medium.

The optics delivering the pump energy, the length of the gain medium and the doping concentration in the gain medium are set in described configurations so that 80 percent or more, and preferably more than 90 percent, of the pump energy is absorbed within the gain medium. In configurations described, these parameters are designed so that the absorption length, at which 1/e of the pump energy is absorbed, is on the order of 10's of millimeters, greater than 50 millimeters in some embodiments, and preferably at least one third, greater than one half in some embodiments, of the length of the gain medium.

Embodiments of the laser system described herein include a pump energy source that supplies 500 Watts or more of energy at a wavelength which has an absorption efficiency that is about 20 percent or less of a maximum absorption efficiency for the gain medium and active element. For example, a laser system is described with a gain medium comprising a rod shaped YAG host with a Nd doping concentration between about 0.05 and 0.5 atomic percent, where the length of the doped YAG host is substantially greater than 50 millimeters, such as 100 millimeters, with a diameter on the order of 10 millimeters or less, and with a source of pump energy providing greater than 500 Watts in a wavelength between 799 and 803 nanometers. Intra-cavity doubled outputs of more that 100 Watts are produced in described configurations. More than 200 Watts output power at 1.064 µm is available in these configurations. The configurations described herein are scalable to produce lower powers, of for example 50 Watts, up to 1000 Watts or more, output in the frequency converted wavelengths, and correspondingly high power primary wavelength outputs. The output wavelength can be configured to fall in a range from about 200 to about 1100 nm in embodiments described herein.

In embodiments of the laser system described herein, the gain medium comprises a long rod of the crystalline host such as YAG, with an undoped end-cap on the first end through which the pump radiation enters the crystal, and optionally with an undoped end-cap on the second end as well.

The pump energy is delivered using optics in an embodiment described herein, which focus the pump energy at a focal point near one end of the gain medium, for propagation along the length of the gain medium. Optical elements are included that are arranged to provide a resonant cavity, which is mode-matched with the spot size of the pump energy at the focal point. The result of this configuration is a high quality output beam, with $M^2$ less than 30, suitable for coupling into fiber optic delivery systems and focusing on relatively small targets.

An embodiment is described in which the laser system is configured to provide output beams that are a frequency converted beam, such as a first, second or third harmonic of the primary wavelength within the laser system. In such an embodiment, a component for frequency conversion is included within the resonant cavity. Also, an embodiment of the system includes a Q-switch within the resonant cavity, for producing high energy, high frequency pulses of output laser light.

The laser configuration described herein is suitable for generation of more than 100 Watts of output at 532 nanometers using an Nd:YAG gain medium and diode laser pumping source. The configuration is stable, easily manufactured and low-cost.

In summary, an end-pumped high-power laser is described which produces a low $M^2$ beam with stable output power. Output powers greater than 100 and even greater than 1000 Watts can be produced using solid-state hosts and diode laser pump sources. The laser configuration supports efficient intra-cavity frequency conversion.

Other aspects and advantages of the present invention can be seen on review of the drawings, the detailed description and the claims, which follow.

DETAILED DESCRIPTION

A detailed description of embodiments of the present invention is provided with reference to the FIGS. 1-6.

Figure 1:
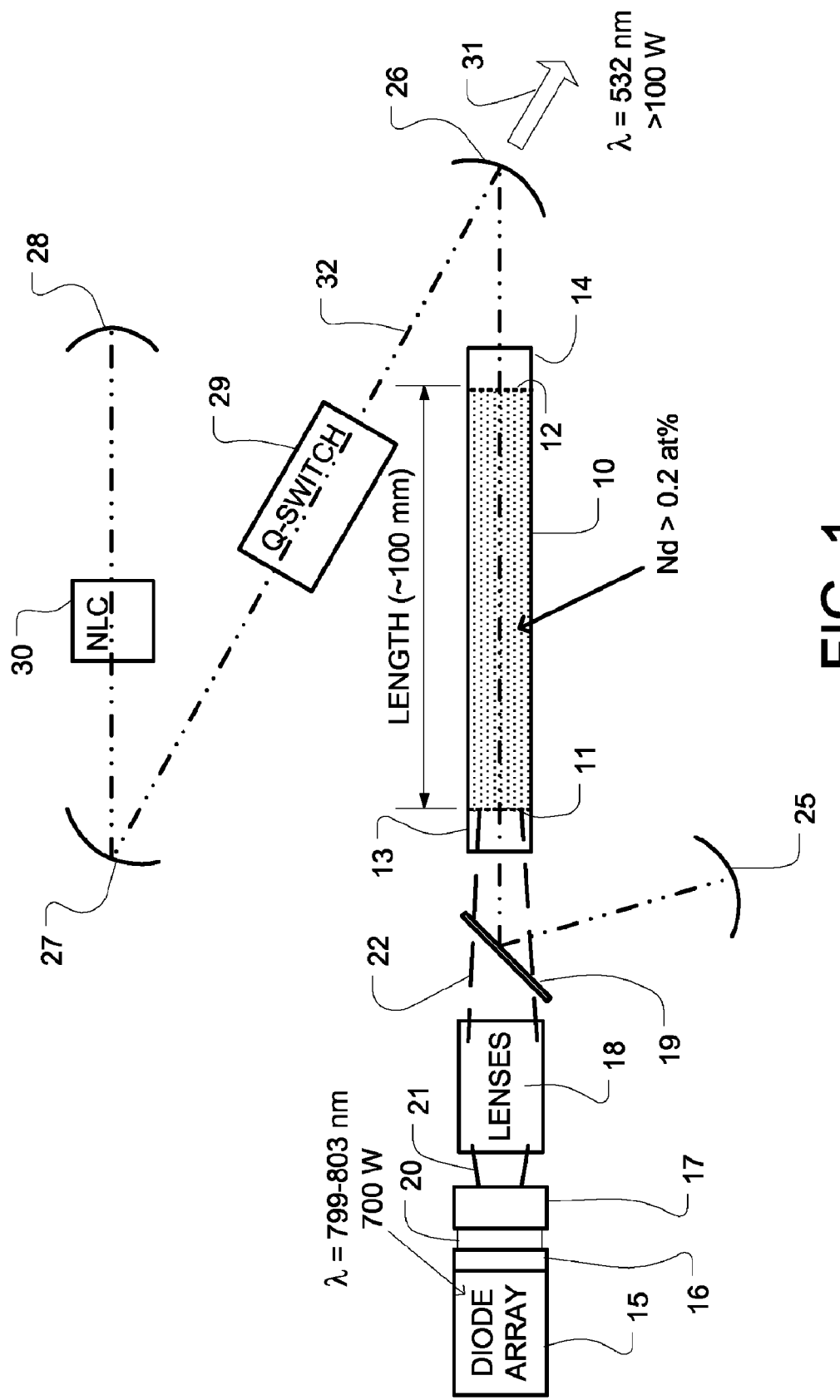
FIG. 1 is a simplified diagram of a diode pumped, solid-state laser system producing over 100 Watts frequency converted output power.

FIG. 1 illustrates a high-power laser system comprising a gain medium 10 that includes a doped crystalline host, having a first end 11 and a second end 12. The gain medium 10 in a representative embodiment comprises Nd:YAG having a length of about 100 millimeters and a diameter of about 4.5 millimeters. The gain medium 10 is water cooled in exemplary embodiments, along the sides of the host. Undoped endcap 13 about 10 millimeters long in this example, is bonded on the first end 11 of the gain medium 10, and undoped endcap 14 also about 10 millimeters long in this example, is bonded on the second end 12 of the gain medium 10.

In the high-power end-pumped configuration shown, the undoped endcap 13 can be diffusion bonded but preferably grown on at least the first end 11. In embodiments where significant pump energy reaches the second end of the host 10, another undoped endcap 14 can be diffusion bonded but preferably grown on the second end 12. The output end of the undoped endcap 14 is coated so that it is reflective at the pump energy wavelength, while transmitting at the resonant mode. In this manner, the pump energy that is unabsorbed at the second end 12 is redirected back to the rod to be absorbed. At the very high pump powers possible using the configuration described herein, rod-end lens effects play a very significant role in the stability of the resonator. Strong absorption of the pump energy at the surface of the gain medium can cause significant distortion to the end face and at high-power levels rod fracture. Rod distortion leads to strong spherical aberration of the beam which severely reduces the quality of the beam. By bonding undoped endcaps onto the doped rod ends, the distortion is avoided, because the absorption now takes place in the bulk and not at a surface. Also, the fracture limit is higher and end effects are substantially eliminated.

A source of pump energy in the illustrated embodiment comprises a diode array 15. A representative embodiment employs a seven bar stack of diode lasers, with each bar producing 100 Watts for 700 Watts total pump energy, centered on 801 nanometers. The wavelength of the bars changes plus or minus 1.5 nanometers in normal operating conditions providing pump energy within a range of about 799 to about 803 nanometers.

Figure 5:
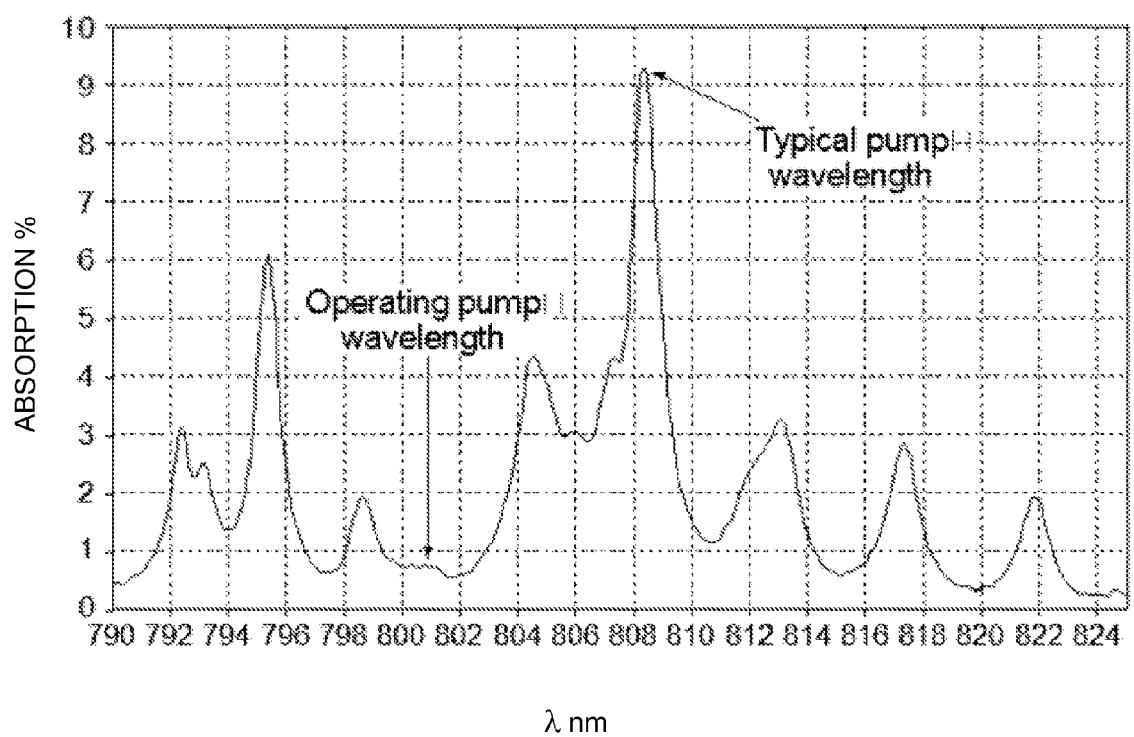
FIG. 5 is a graph of absorption efficiency versus wavelength for pump energy sources in an Nd:YAG gain medium.

FIG. 5 shows the absorption efficiency versus pump energy wavelength over practical range of wavelengths, for Nd:YAG. As shown, a maximum in the range occurs at about 808 nanometers. The pump energy range of 799 to 803 lies substantially off the peak at 808, at a level that is less that 20 percent of the maximum absorption. For 801, plus or minus 1.5 nanometers, the absorption is less than about 10% of the maximum absorption at the peak near 808 nanometers. Other pump energy ranges are suitable as well, including wavelengths near 825 nanometers or beyond the illustrated range. One specific advantage of pumping at wavelength with absorption efficiencies that are substantially off peak is a tolerance to wavelength shifts. When pumping at 801 nanometers in the Nd:YAG in the described embodiment, wavelength shifts of plus or minus 1.5 nanometers have essentially no effect on the laser output.

Pump energy is delivered through optics, including a fast axis collimation lens 16, a polarization multiplexer which acts as a beam interleaver, brightness doubler 17, and a set of lenses 18 arranged as a telescope to focus the pump energy near the first end 11 of the gain medium 10. The pump energy is delivered at the output of the fast access collimation lenses 16 on a path 20 to the beam interleaver, brightness doubler 17. The pump energy is concentrated to one half its width at the output of the beam interleaver, brightness doubler 17 on path 21 and is delivered through the lenses 18 on path 22 to a focal point at or near the first end 11 of the gain medium 10.

In embodiments of the invention, the fast axis collimation lens 16 can be deliberately defocused slightly to facilitate homogenization of the pump beam at the focal point in the gain medium 10. The beam interleaver, brightness doubler 17 reduces the width of the pump energy output by one half, facilitating focusing of the pump energy into a relatively small diameter rod shaped gain medium 10, with a longer working distance. The lenses 18 can be varied to adjust the spot size at the focal point in the gain medium 10 over a range of operating parameters as suits a particular implementation. For example, the spot size at the focal point can be varied over range about 10 percent to about 90 percent of the diameter of the rod shaped gain medium 10.

The pump energy passes through a beam splitter 19 that is used to turn the resonating energy to the optics defining resonant cavity. The system includes optical elements including concave mirror 25, that is highly reflective at the resonating energy of 1064 nanometers, beam splitter 19, which is reflective at 1064 nanometers and transmissive at the wavelength of the pump energy source around 801 nanometers, concave mirror 26 that is highly reflective at 1064 nanometers and transmissive at an output wavelength of 532 nanometers, concave mirror 27 that is highly reflective at both 1064 and 532 nanometers, and concave mirror 28 which is highly reflective at both 1064 and 532 nanometers. The optical elements 25, 19, 26, 27, 28 define a resonant path 32 which is essentially Z-shaped, with a tail between then beam splitter 19 and the highly reflective concave mirror 25.

In the illustrated embodiment, Q-switch 29 is placed in the resonant cavity between the mirrors 26 and 27. Also, a nonlinear crystal 30, such as LBO, is placed between the mirrors 27 and 28. The Z-shaped resonant cavity can be configured as discussed in U.S. Pat. No. 5,025,446 by Kuizenga, imaging the resonant mode at one end of the gain medium 10 at the nonlinear crystal 30. The configuration described is stable and highly efficient for frequency conversion. The configuration shown in FIG. 1 produces a frequency converted output (wavelength 532 nanometers in illustrated embodiment) of greater than 100 Watts on line 31.

Figure 2:
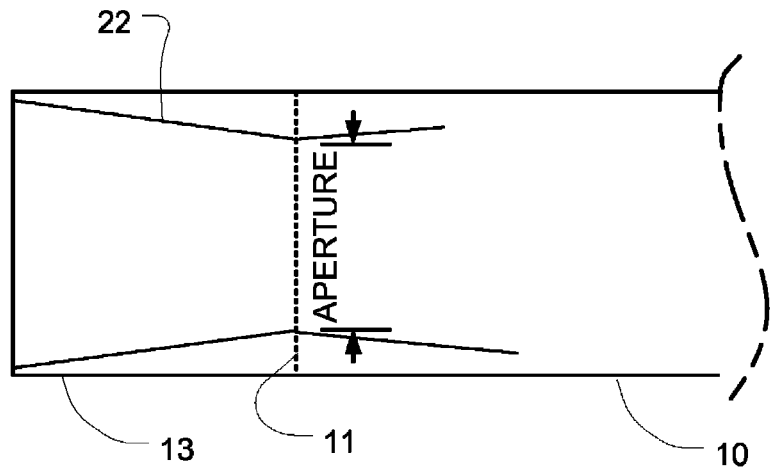
FIG. 2 illustrates one end of a gain medium in a system such as described with reference to FIG. 1.
Figure 3:
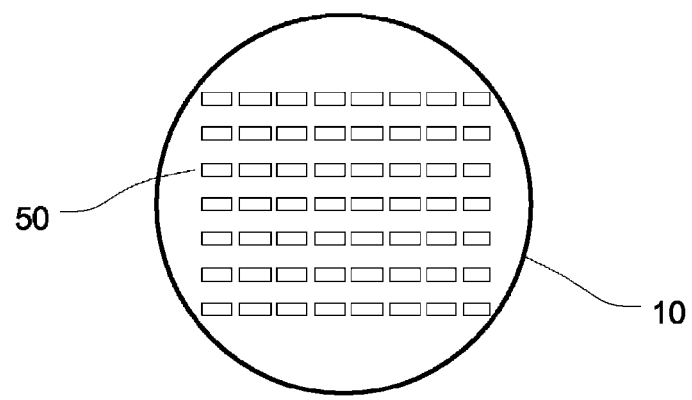
FIG. 3 is a schematic illustration of the distribution of pump energy at one end of the gain medium for a system such as described with reference to FIG. 1.
Figure 4:
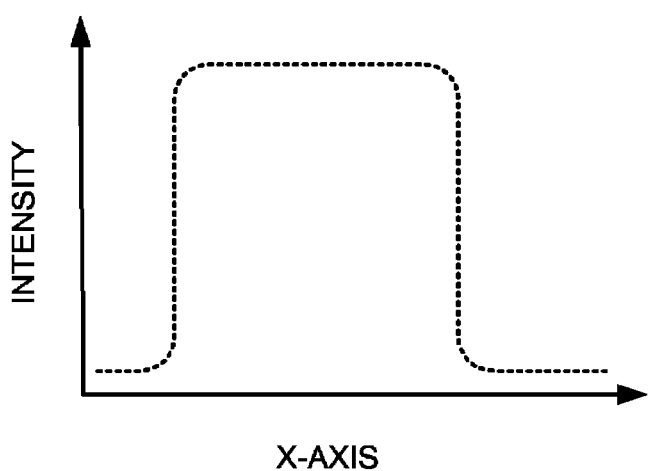
FIG. 4 illustrates in intensity profile on at least one dimension of the pump energy delivered to one end of the gain medium for a system such as described with reference to FIG. 1.

The pump spot size at the focal point near the first end 11 of the gain medium 10 affects in the mode quality of the laser system, controls the gain, and the strength of the thermal lensing. FIGS. 2 and 3 illustrate features of the pump spot size at the focal point. FIG. 2 shows the gain medium 10, and the undoped endcap 13 on the first end 11 of the gain medium 10. The pump energy is focused on path 22 to the focal point near the first end 11. This establishes an aperture near the first end for the resonant mode in the cavity. The gain is inversely proportional to the area and divergence of the pump beam at the focal point near the first end 11 of the gain medium 10 at the doped/undoped interface of the rod. The smaller the spot size, the high the gain for a given rod. The thermal lens is also inversely proportional to the pump spot size at the focal point. As the pump spot gets smaller, the thermal lens increases. Also, the distribution of light across the pump spot has a strong effect on the thermal lens. FIG. 3 illustrates the distribution light from the pump energy source at the first end 11 on the rod, which results from imaging the output of the laser diode source on the first end 11 of the rod. As illustrated in FIG. 3, there are seven rows of diode laser outputs, such as row 50. The result is a substantially uniform intensity profile, as illustrated in FIG. 4 along the horizontal dimension in the FIG. 4, which lies on an axis that is parallel to the row 50 of laser diode spots. The rows are separated by a small distance in the vertical dimension in an embodiment where the fast axis collimation lenses 16 are focused. By slightly defocusing the fast axis collimation lenses 16, the distribution of energy can be made more uniform in the second, vertical dimension. The system is designed therefore to homogenize and flatten the pump profile to reduce the thermal lensing.

Also, the spot size at the focal point affects transverse modes of the laser. The transverse modes of the laser are controlled by the pump spot size and distribution of energy within about the first 30 percent of the rod length in which a most of the pump energy is absorbed. As the spot size at the focal point is reduced, the mode quality improves. The optical elements 25, 19, 26, 27, 28 defining the resonant cavity are configured to mode match with the aperture defined by the pump energy spot size at the focal point.

The doping concentration in the gain medium 10 is chosen based on the mode quality and output power required. The doping level is relatively low to allow distribution of the thermal load along the optical axis of the gain medium 10 (e.g., 1/e absorption length of more than 50 millimeters in a rod less than 10 millimeters in diameter), thereby reducing the thermal stresses induced at the input to the gain medium. In an embodiment described, the doping concentration is about 0.27 atomic percent for the rod shown in FIG. 1, that is about 100 millimeters long between the first end 11 and the second end 12, and pumped substantially off-peak at about 801 nanometers where the absorption efficiency is less than 10 percent of the maximum absorption efficiency at the peak near 808 nanometers for Nd:YAG. The 1/e absorption length for this embodiment is about 66 millimeters, more than half the length of the 100 millimeters rod.

Ranges of doping concentrations for embodiments of the invention comprising an Nd:YAG rod can fall within about 0.05 and about 0.5 atomic percent, and more preferably in a range between about 0.2 and 0.4 atomic percent for readily and consistently manufacturable commercial applications. The pump energy wavelength, doping concentration and the length of the rod are adapted in a preferred embodiment, so that the absorption length is over one third the rod length, and more than 90 percent of the pump energy is absorbed within two passes along the length of the rod, as the unabsorbed pump energy which reaches the second end 12 of the rod is reflected back towards the first end 11. The amount of unabsorbed pump energy that reaches the first end 11 is very low, and has insubstantial effects on the characteristics of the pump energy at the focal point.

By establishing a suitable combination of parameters including the length for the gain medium, the doping concentration, the pump energy profile at the focal point, and the pump energy wavelength, output powers greater than 100 Watts of frequency converted output at 532 nanometers are readily generated with an Nd:YAG rod about 100 millimeters long and about 4.5 millimeters in diameter with reasonably high quality beam. The technology is scalable to configurations supporting pump energy in the kilowatt range for hundreds of Watts of output power in the primary and harmonic wavelengths for the laser.

Beam quality can be characterized by the parameter $M^2$. The higher $M^2$, the lower the beam quality, and the more difficult it is to focus of the beam on a small spot and to couple the beam into small numerical aperture delivery devices such as fiber optics. $M^2$ of less than 30 is readily achieved using the technology described herein, allowing coupling into fiber optics on the order 100 microns and up in diameter, which provides a beam with low divergence suitable for many high-power applications of laser light, including medical applications.

The technology described herein is adaptable to other configurations of the resonant cavity, with or without frequency conversion and with or without Q-switching, and adaptable to other gain media and pump energy sources within the parameters described herein.

Figure 6:
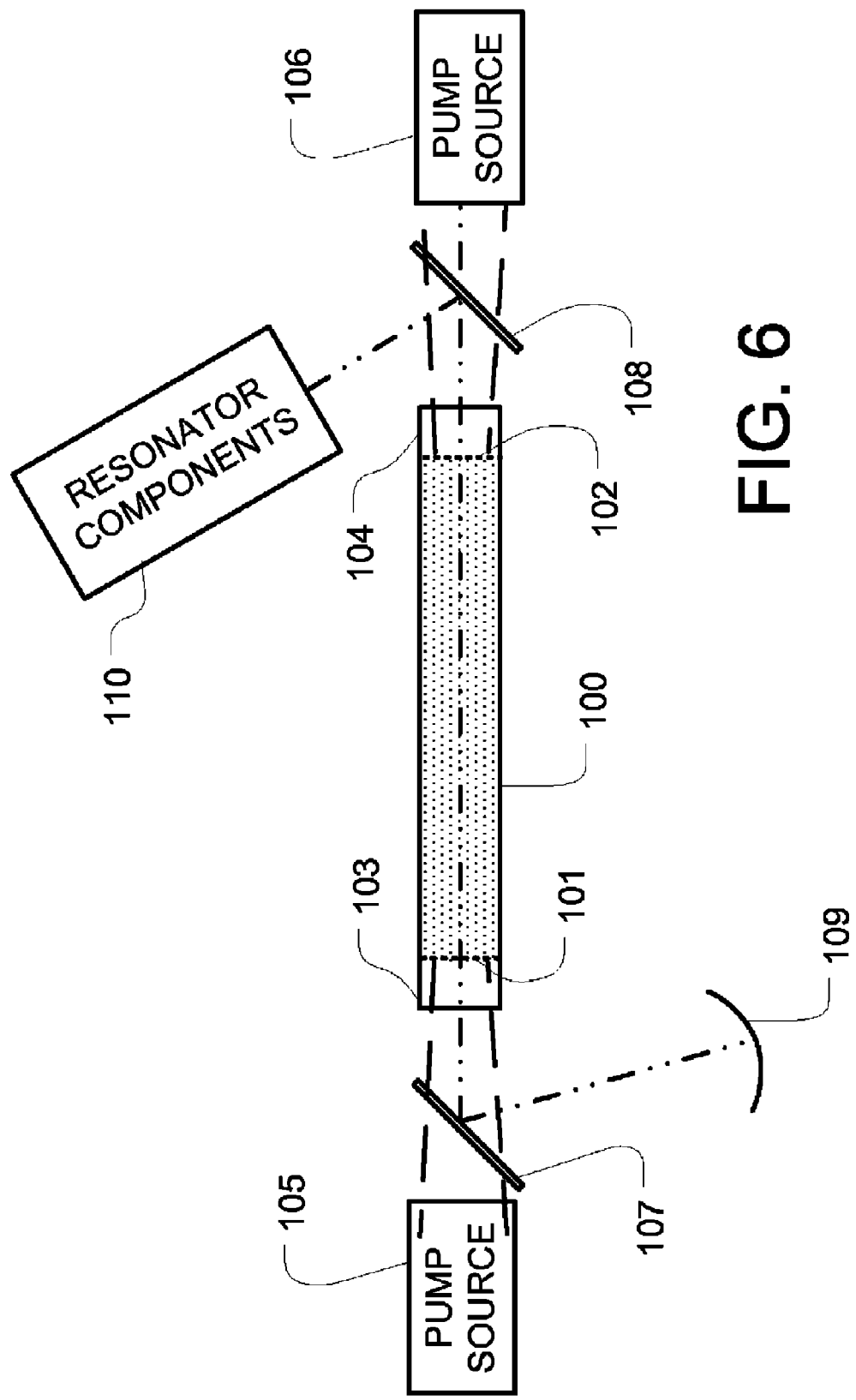
FIG. 6 is a simplified diagram of an alternative diode pumped, solid-state laser system for producing high output powers.

FIG. 6 illustrates one alternative laser system configuration, in which pump energy is provided at both ends of the gain medium, for higher output powers. In the illustrated system, a gain medium 100 having a length between a first end 101 and a second end 102, on the order 50 to 100 millimeters or longer, is provided. Undoped endcaps 103, 104 are bonded to the first end 101 and second end 102 respectively. A first source of pump energy 105 directs more than 100 Watts of pump energy through a beam splitter 107 to a focal point near the first end 101 at a wavelength which is detuned from the maximum absorption wavelength for the gain medium. A second source of pump energy 106 directs more than 100 Watts of pump energy through a beam splitter 108 to a focal point near the second end 102, at a wavelength which is detuned from the maximum absorption wavelength. Optical components 109 and 110 are arranged to provide resonant cavity for the primary wavelength. The combination of parameters including the length for the gain medium, the doping concentration, the pump energy profiles at the focal points on the ends of the gain medium, and the pump energy wavelengths substantially detuned from the maximum absorption wavelengths, are established for absorption lengths of at least one-third of the rod length, so that high output powers and high quality beams are produced. The resonator components represented by block 110 are adapted to a particular application of the laser system, and may comprise of mirrors, polarizers, Q-switches, non-linear crystals, apertures, filters, etalons, half wave plates, and other devices.

Embodiments of the laser system may deploy one or more diode stacks or other pump energy sources, may include one or more gain media, and may include a variety of resonant cavity configurations. Laser systems employing the technology described herein can be implemented that operate in a continuous wave CW mode, a Q-switched mode and mode-locked modes, depending on the preferred output characteristics.

An end-pumped, high-power laser is described which produces an output with low $M^2$ and stable output power. The doping level of the gain medium is adjusted, the pump wavelength is detuned off major pump bands, and the length of the gain medium is a selected to allow very high-power pumping while maintaining low thermal stress and thermal lensing. The gain aperture for the system can be determined by the spot size of the pump energy focused on an end of the gain medium. The laser system can be very efficiently intra-cavity frequency converted to second, third and higher harmonic frequencies.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A laser system, comprising:
a gain medium having a doping concentration and an absorption profile for absorption efficiency over a range of pump energy wavelengths and having a maximum absorption efficiency within the range, the gain medium having a first end, a second end and a length of 50 millimeters or more between the first and second ends;
a source of pump energy having a wavelength at which the absorption efficiency is less than the maximum; and
optics arranged to deliver the pump energy through the first end of the gain medium to propagate along the length of the gain medium;
wherein the optics, pump energy wavelength, the length of the gain medium and the doping concentration of the gain medium establish absorption of greater than 80% of the pump energy delivered to the gain medium, and a 1/e absorption length of greater than one third the length of the gain medium, wherein the optics arranged to deliver the pump energy are adapted to image the pump energy at an image plane near the first end of the gain medium.

2. The laser system of claim 1, wherein greater than 90% of the pump energy delivered to the gain medium is absorbed in the gain medium.

3. The laser system of claim 1, wherein greater than 95% of the pump energy delivered to the gain medium is absorbed in the gain medium.

4. The laser system of claim 1, wherein the optics arranged to deliver the pump energy include a component to redirect pump energy that exits the second end back through the gain medium, and greater than 90 percent of the pump energy is absorbed within 2 passes through the gain medium.

5. The laser system of claim 1, wherein the output wavelength is in a range from about 200 to about 1100 nm.

6. The laser system of claim 1, wherein the 1/e absorption length is less than the length of the gain medium.

7. The laser system of claim 1, wherein the gain medium comprises a solid-state host with Nd doping, and the absorption efficiency of the pump energy is about 20% or less of the absorption efficiency at a peak near 808 nm in the profile.

8. The laser system of claim 1, wherein the gain medium comprises a solid-state host with Nd doping, and the pump energy has a wavelength in a range of about 799-803 nm.

9. The laser system of claim 1, wherein the gain medium comprises a YAG host with Nd doping within a range of about 0.2 to about 0.4 atomic percent.

10. The laser system of claim 1, wherein the gain medium comprises a doped solid-state host, and including an undoped end-cap on the first end.

11. The laser system of claim 1, wherein the gain medium comprises a doped solid-state host, and including an undoped end-cap on the first end and an undoped endcap on the second end.

12. The laser system of claim 1, wherein the gain medium comprises a doped solid-state host.

13. The laser system of claim 1, wherein the optics arranged to deliver the pump energy are adapted to image the pump energy at an image plane near the first end of the gain medium with a spot size, including optical elements arranged to provide a resonant cavity to provide a laser output, the resonant cavity being mode-matched with the spot size of the pump energy at the image plane.

14. The laser system of claim 1, wherein the source of pump energy comprises an array of laser diodes.

15. The laser system of claim 1, wherein the source of pump energy supplies about 100 Watts or more.

16. The laser system of claim 1, wherein the source of pump energy supplies about 500 Watts or more.

17. The laser system of claim 1, including optical elements arranged to provide a resonant cavity to provide a laser output, wherein the pump energy is sufficient to generate laser output at greater than 100 Watts.

18. The laser system of claim 1, including optical elements arranged to provide a resonant cavity with a component for frequency conversion to provide a frequency converted laser output, wherein the pump energy is sufficient to generate the laser output at greater than 100 Watts.

19. The laser system of claim 1, including optical elements arranged to provide a resonant cavity with a Q-switch and a component for frequency conversion to provide a frequency converted laser output, wherein the pump energy is sufficient to generate the laser output at greater than 100 Watts.

20. The laser system of claim 1, including optical elements arranged to provide a resonant cavity to provide a laser output, wherein the pump energy is sufficient to generate laser output at greater than 100 Watts with $M^2$ of less than 30.

21. The laser system of claim 1, including a second source of pump energy and optics arranged to deliver the pump energy from the second source through the second end of the gain medium to propagate along the length of the gain medium.

22. A laser system, comprising:
a gain medium comprising an Nd doped crystalline host having a doping concentration and having a peak absorption efficiency near about 808 nm, the gain medium having a first end, a second end and a length between the first and second ends;
a source of pump energy delivering more than 100 Watts with a wavelength at which the absorption efficiency less than 20 percent the peak; and
optics arranged to deliver the pump energy through the first end of the gain medium to propagate along the length of the gain medium, wherein the optics arranged to deliver the pump energy image the pump energy at an image plane near the first end of the gain medium.

23. The laser system of claim 22, wherein the absorption efficiency of the pump energy is about 10% or less of the absorption efficiency at the peak.

24. The laser system of claim 22, wherein the gain medium comprises a YAG host with Nd doping within a range of about 0.05 to about 0.5 atomic percent.

25. The laser system of claim 22, wherein the gain medium comprises a YAG host with Nd doping within a range of about 0.2 to about 0.4 atomic percent.

26. The laser system of claim 22, wherein the length of the gain medium and the doping concentration of the gain medium establish a 1/e absorption length of 50 millimeters or more.

27. The laser system of claim 22, including an undoped end-cap on the first end.

28. The laser system of claim 22, including an undoped end-cap on the first end and an undoped end-cap on the second end.

29. The laser system of claim 22, wherein the gain medium comprises a doped solid-state host.

30. The laser system of claim 22, wherein the optics arranged to deliver the pump energy are adapted to image the pump energy at an image plane near the first end of the gain medium with a spot size, including optical elements arranged to provide a resonant cavity to provide a laser output, the resonant cavity being mode-matched with the spot size of the pump energy at the image plane.

31. The laser system of claim 22, wherein the source of pump energy comprises an array of laser diodes.

32. The laser system of claim 22, wherein the source of pump energy supplies about 500 Watts or more.

33. The laser system of claim 22, including optical elements arranged to provide a resonant cavity to provide a laser output, wherein the pump energy is sufficient to generate laser output at greater than 100 Watts.

34. The laser system of claim 22, including optical elements arranged to provide a resonant cavity with a component for frequency conversion to provide a frequency converted laser output, wherein the pump energy is sufficient to generate the laser output at greater than 100 Watts.

35. The laser system of claim 22, including optical elements arranged to provide a resonant cavity with a Q-switch and a component for frequency conversion to provide a frequency converted laser output, wherein the pump energy is sufficient to generate the laser output at greater than 100 Watts.

36. The laser system of claim 22, including optical elements arranged to provide a resonant cavity to provide a laser output, wherein the pump energy is sufficient to generate laser output at greater than 100 Watts with $M^2$ of less than 30.

37. The laser system of claim 22, including a second source of pump energy and optics arranged to deliver the pump energy from the second source through the second end of the gain medium to propagate along the length of the gain medium.

38. A laser system, comprising:
a gain medium having a doping concentration and an absorption profile for absorption efficiency over a range of pump energy wavelengths and having a maximum absorption efficiency within the range, the gain medium having a first end, a second end and a length between the first and second ends;
a source of pump energy having a wavelength at which the absorption efficiency substantially less than the maximum; and
optics arranged to deliver the pump energy through the first end of the gain medium to propagate along the length of the gain medium and adapted to image the pump energy at an image plane at or near the first end of the gain medium with a spot size;
optical elements arranged to provide a resonant cavity to provide a laser output, the resonant cavity being mode-matched with the spot size of the pump energy at the image plane and including a Q-switch and a component for frequency conversion to provide a frequency converted laser output;
wherein optics arranged to deliver the pump energy, the length of the gain medium and the doping concentration of the gain medium establish a 1/e absorption length of greater than one third the length of the gain medium and 90% or more of the pump energy is absorbed within 2 or less passes through the gain medium, and wherein the pump energy is sufficient to generate the frequency converted laser output at greater than 50 Watts.

39. The laser system of claim 38, wherein the pump energy is sufficient to generate the frequency converted laser output at greater than 100 Watts.

40. The laser system of claim 38, wherein the source of pump energy supplies about 500 Watts or more.

41. The laser system of claim 38, wherein the source of pump energy comprises an array of laser diodes delivering about 500 Watts or more, and the optics arranged to deliver the pump energy establish a substantially uniform intensity across the spot size in at least one dimension and include fast axis collimation lenses slightly defocused to improve uniformity of the intensity profile at the focal point in a second dimension.

42. The laser system of claim 38, wherein the gain medium comprises a solid-state host with Nd doping, and the absorption efficiency of the pump energy is about 10% or less of the absorption efficiency at a peak near 808 nm in the profile.

43. The laser system of claim 38, wherein the gain medium comprises a YAG host with Nd doping within a range from 0.05 to 0.5 atomic percent.

44. The laser system of claim 38, wherein the gain medium comprises a YAG host with Nd doping within a range of about 0.2 to about 0.4 atomic percent.

45. The laser system of claim 38, wherein the gain medium comprises a doped solid-state host, and including an undoped end-cap on the first end, the first end being at an interface between the doped solid-state host and the undoped end-cap.

46. The laser system of claim 38, wherein the gain medium comprises a doped solid-state host, and including an undoped end-cap on the first end and an undoped endcap on the second end.

47. A laser system, comprising:
a gain medium comprising a crystalline host with Nd doping at a concentration between about 0.05 and 0.5 atomic percent having a maximum absorption efficiency near 808 nm, the gain medium having a first end, a second end and a length between the first and second ends of 50 millimeters or more, and including an undoped end-cap on the first end, the first end being at an interface between the doped solid-state host and the undoped end-cap;
a array of laser diodes supplying pump energy greater than 500 Watts, having a wavelength at which the absorption efficiency substantially less than the maximum; and
optics arranged to deliver the pump energy through the first end of the gain medium to propagate along the length of the gain medium and adapted to image the pump energy at an image plane at or near the first end of the gain medium with a spot size, with a substantially uniform intensity across the spot size in at least one dimension; and
optical elements arranged to provide a resonant cavity to provide a laser output, the resonant cavity being mode-matched with the spot size of the pump energy at the image plane, and including a Q-switch and a component for frequency conversion to produce a frequency converted output, the frequency converted output greater than 100 Watts.

48. The laser system of claim 47, including an undoped end-cap having a first surface on the second end and having a second surface that is at least partially reflective at wavelength of the pump energy to redirect unabsorbed pump energy back into the host toward the first end.

49. The laser system of claim 47, wherein the crystalline host comprises YAG.

50. The laser system of claim 47, wherein the gain medium comprises a YAG host with Nd doping within a range of about 0.2 to about 0.4 atomic percent.

* * * * *